United States Patent
Maris

(10) Patent No.: US 9,329,224 B2
(45) Date of Patent: May 3, 2016

(54) OPTICAL TESTING OF A MULTI QUANTUM WELL SEMICONDUCTOR DEVICE

(75) Inventor: Humphrey J. Maris, Barrington, RI (US)

(73) Assignee: Brown University, Providence, RI (US)

(*) Notice: Subject to any disclaimer, the term of this patent is extended or adjusted under 35 U.S.C. 154(b) by 373 days.

(21) Appl. No.: 14/112,800

(22) PCT Filed: Apr. 2, 2012

(86) PCT No.: PCT/US2012/031836
§ 371 (c)(1),
(2), (4) Date: Jan. 3, 2014

(87) PCT Pub. No.: WO2013/101275
PCT Pub. Date: Jul. 4, 2013

(65) Prior Publication Data
US 2014/0111241 A1    Apr. 24, 2014

Related U.S. Application Data

(60) Provisional application No. 61/478,255, filed on Apr. 22, 2011.

(51) Int. Cl.
*G01B 11/16*  (2006.01)
*G01R 31/265*  (2006.01)
(Continued)

(52) U.S. Cl.
CPC .......... *G01R 31/2656* (2013.01); *G01R 31/44* (2013.01); *H01L 33/0095* (2013.01); *H02S 50/10* (2014.12); *H01L 33/06* (2013.01); *H01L 33/32* (2013.01)

(58) Field of Classification Search
CPC .. G02B 6/43; G02B 2006/12145; G02B 6/12; G02B 6/122; G02B 6/1342; G02B 6/29338; G02B 6/3596; G02B 6/4202; G02B 6/4239; G02B 6/4295; G01B 9/02001; G01B 9/02091; G01J 2005/0077; G01J 3/2803
See application file for complete search history.

(56) References Cited

U.S. PATENT DOCUMENTS 5,748,318 A    5/1998 Maris et al.
5,754,714 A *  5/1998 Suzuki ................. B82Y 20/00
                                                    385/131
(Continued)

FOREIGN PATENT DOCUMENTS

WO    WO 98/28656    7/1998

OTHER PUBLICATIONS

International Search Report for International Application No. PCT/US2012/031836 mailed Aug. 8, 2013 (3 pages).
(Continued)

*Primary Examiner* — Michael P Stafira
(74) *Attorney, Agent, or Firm* — Merchant & Gould P.C.

(57) ABSTRACT

A pump light pulse is generating a strain pulse in a sample that includes quantum wells. A signal is measured using a probe light pulse. The probe light pulse is delayed in relation to the pump light pulse. The signal derives from a change in an optical property of the sample, which optical property responds to the generated strain pulse. One may deduce parameters of interest of the sample, including the quantum wells, from the characteristics of the signal. For discerning between various components of the stress in the quantum wells a lead pump pulse, preceding the pump light, pulse my also be used. A system for the application of such methods is also disclosed.

22 Claims, 6 Drawing Sheets

(51) Int. Cl.
  *H01L 33/00* (2010.01)
  *G01R 31/44* (2006.01)
  *H02S 50/10* (2014.01)
  *H01L 33/06* (2010.01)
  *H01L 33/32* (2010.01)

(56) References Cited

U.S. PATENT DOCUMENTS

| | | |
|---|---|---|
| 5,844,684 A | 12/1998 | Maris et al. |
| 6,356,370 B1 * | 3/2002 | Damen ................. G02F 1/3536 359/326 |
| 2011/0133100 A1 * | 6/2011 | Kambhampati ....... B82Y 20/00 250/459.1 |

OTHER PUBLICATIONS

Chen et al. "Narrow-band detection of propagating coherent acoustic phonons in piezoelectric InGaN/GaN multiple-quantum wells." *Applied Physics Letters. vol. 91.* 2007. pp. 133101-1-3.

Chern et al. "Transmission of light through quantum heterostructures modulated by coherent acoustic phonons." *J. of Applied Physics. vol. 95. No. 3.* 2004.pp. 1114-1121.

Matsuda et al. "Acoustic phonon generation and detection in GaAs/$Al_{0.3}GA_{0.7}As$ quantum wells with picosecond laser pulses." *Physical Review B. vol. 71.* 2005. pp. 115330-1-13.

Sun et al. "Coherent Acoustic Phonon Oscillations in Semiconductor Multiple Quantum Wells with Piezoelectric Fields." *Physical Review Letters. vol. 84. No. 1.* 2000. pp. 179-182.

* cited by examiner

OPTICAL TESTING OF A MULTI QUANTUM WELL SEMICONDUCTOR DEVICE

This application is a National Stage Application of PCT/US2012/031836, filed 2 Apr. 2012, which claims benefit of U.S. Provisional Ser. No. 61/478,255, filed 22 Apr. 2011 and which applications are incorporated herein by reference. To the extent appropriate, a claim of priority is made to each of the above disclosed applications.

FIELD OF THE INVENTION

The present invention relates to nondestructive optical testing of semiconductor device structures. In particular it relates to determining parameters of multi quantum well devices.

BACKGROUND

There is interest in the development of light emitting devices of improved energy efficiency. Development of devices based on various types of light emitting devices, such as, for instance, semiconductor diodes (LEDs) or lasers serve this purpose.

The efficiency of light generation in the devices is dependent on precise control of various device parameters. Measuring some of the parameters may be a difficult and unsolved task.

BRIEF SUMMARY

A method is disclosed which involves creating a strain pulse with a pump light pulse in a sample that includes quantum wells, and measuring a signal using a probe light pulse which is delayed in relation to the pump light pulse. The signal derives from a change in an optical property of the sample, which optical property responds to the strain pulse. Parameters of interest about the sample may be deduced from the characteristics of the signal. The method further discloses the use of a lead pump pulse which precedes the pump light pulse by a lead time interval. A system for the application of such methods is also disclosed.

BRIEF DESCRIPTION OF THE DRAWINGS

These and other features of embodiments of the invention will become apparent from the accompanying detailed description and drawings, wherein.

DETAILED DESCRIPTION

In order to improve the efficiency of light generation and also to extend the range of wavelengths that can be produced, it has been found advantageous to use heterostructures, i.e., structures made of a number of materials of different composition. These may include III-V compounds of Al, Ga, or In combined with N, P, or As, and various II-VI compounds.

Figure 1:
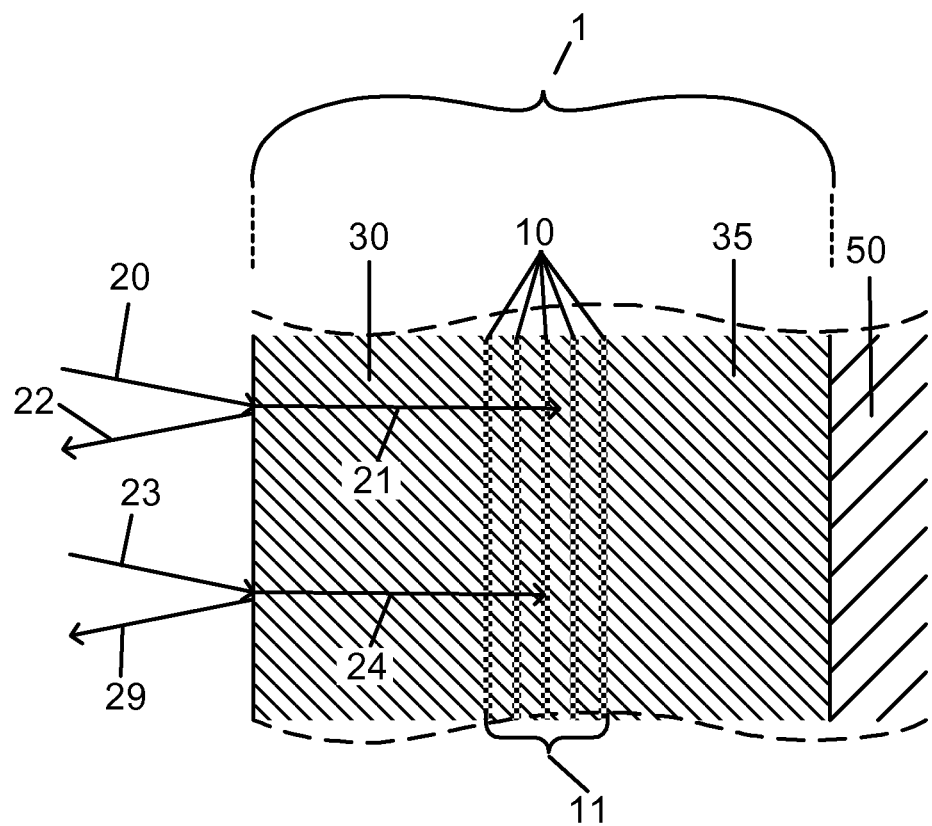
FIG. 1 schematically shows a multi quantum well (MQW) structure exposed to pump light pulses.

FIG. 1 schematically shows a representative multi quantum well (MQW) LED, or laser. The light emitting device structure, or sample 1, may be supported by a substrate 50, with quantum wells (QW) 10 sandwiched in-between two semiconductor layers 30, 35. Such layers may be an n-type layer and a p-type layer of the same semiconductor. In representative embodiments both layers 30, 35 may be of GaN, and the quantum wells of $In_cGa_{1-c}N$, that alternate with GaN in-between the QW. The structure with several such QW layers is referred to as a multiple quantum well structure, or MQW. Generally the whole sample 1, which includes the quantum wells 10 and their region 11, and the two semiconductor layers 30, 35, forms a single crystalline structure. Such MQW LED structures are usually epitaxially deposited commencing from the substrate 50. The MQW region 11 includes beside the QW 10 the material in between the QW. In typical embodiments the width of the QW may be 2 to 20 nm, and they number 2 to 50, but more typically in the range of 5 to 10. The total width of the MQW region 11 maybe 50 to 500 nm.

The QW 10 have a smaller band gap than the semiconductor layer, and the electrons and holes combine principally in these wells. Because of the smaller band gap in the QW 10 electrons and holes are to some extent confined in these layers. When the thickness of the QW is decreased, the energy of the electrons increases as a result of quantum effects. Devices of this general type have been shown to have high efficiency and can be used to produce light with wavelengths in the range below 400 nm.

Other devices may contain extra layers beyond what is shown in FIG. 1. For example, there may be other layers between the top semiconductor layer 30 and the MQW 10. Furthermore, there may be a layer of larger bandgap, in a typical example $Al_cGa_{1-c}N$, between the bottom semiconductor layer 35 and the MQW region 11. In general, description of various embodiments should not be read in a restrictive manner. All semiconductor structures with a MQW region 11 between two semiconductor layers 30, 35 are within the scope of the embodiments of the present disclosure. The wavy dashed line boundaries indicate that in the lateral extension, x, and/or y direction, the figure may show only a small part of the sample, without any intent of conveying information regarding such lateral extension.

FIG. 1 also schematically indicates a pump light pulse 20 directed to the sample 1 at a preselected angle. Part of the light is reflected 22, and part 21 penetrates the sample. In some embodiments of invention the light inside 21 the sample may travel essentially perpendicularly to the quantum wells 10. The term "essentially perpendicularly" is intended to mean not more than about 20° deviation from perpendicularly to the quantum wells.

In order for these devices to have the desired performance and to have a long working life it is essential for all aspects of their fabrication to be precisely controlled. The sample may have a number of parameters of interest that informs regarding the quality and fabrication of the sample. The present invention makes it possible to non-destructively measure several of such parameters of interest for the structure.

In the devices described above it is desirable to know the state of strain in the structure. In an embodiment, GaN-based LEDs are frequently grown on a sapphire substrate 50. However, the lattice parameter of GaN differs from that of sapphire by approximately 16%. Thus, a layer of GaN grown on sapphire is highly strained. As the thickness of the layer increases, the strain is relaxed as a result of a high density of dislocations in the GaN.

Strain also occurs within the $In_cGa_{1-c}N$ layers of a MQW structure. This strain arises because the lattice parameter of GaN is less than the lattice parameter of $In_cGa_{1-c}N$ material. When a thin film of $In_cGa_{1-c}N$ is grown epitaxially on GaN the lattice parameter of the film in the direction parallel to the interface is forced to have the same value as in the GaN. In this situation the film is said to be pseudo-morphic. The QW 10 of $In_cGa_{1-c}N$ film may be under a lateral compressive strain. In the Voigt notation of elasticity this lateral strain has two equal components $\eta_1$ and $\eta_2$ where 1 and 2 refer to the directions x and y lying in the plane of the film; there is also a strain $\eta_3$ in the direction z normal to the plane of the film. The strain in the plane of the film is compressive since the spacing of the atoms in the plane of the film in the $In_cGa_{1-c}N$ is less than the spacing that occurs in bulk $In_cGa_{1-c}N$ material. As known in the art, the magnitude of these strains varies approximately linearly with the indium concentration. The compressive lateral strain is approximately 0.1 c where c is the fractional concentration of indium. In the Voigt notation the stress component $\sigma_3$ is zero and the components $\sigma_1$ and $\sigma_2$ are equal. The strain may be as large 0.01 and the associated stress can be in excess of 1 GPa.

Because $In_cGa_{1-c}N$ is piezoelectric, the strain results in a large electric field in the film, which is estimated in the art to be approximately 83 kV per cm multiplied by the percentage of indium.

In an embodiment of the invention described here a short pump light pulse 20 is directed at the sample. The duration of the pump light pulse can be as short as 10 fs ($10^{-14}$ sec) or as long as 100 ps ($10^{-10}$ sec). The pump light pulse has an intensity, which can be varied. In a characteristic embodiment of the invention the energy deposited into the sample 1 by the pump light pulse 20 may lie in the range between $10^{-5}$ to $10^{-1}$ J/cm$^2$. In one variation of the invention the wavelength of this light pulse is chosen so that it is not absorbed, or is only weakly absorbed, in the uppermost layer 30. For example, a wavelength of 400 nm is only weakly absorbed. As a result a substantial part of the energy of the pump light pulse 20 is able to reach the MQW part of the structure. Because the band gap is smaller in the $In_cGa_{1-c}N$ layers, the absorption is stronger in these layers. The wavelength of the pump light pulse 20 is selected in such manner to be absorbed in the quantum wells 10. The electrons and holes, customarily called electron/hole pairs, that are excited in the layers move rapidly under the influence of the electric field that exists in these layers and they accumulate at the edges of the layers. The generated electron/hole pairs themselves create and electric field. As a result of the accumulation of electron/hole charge at these locations and the electric field created by the electron/hole pairs, the original electric field in each layer is reduced. Because the material is piezoelectric, this change in the electric field results in a sudden change in the stress. This change in the stress in turn results in motion of the structure. More specifically, the change in the stress component $\sigma_3$, the one perpendicular to the plane of the QW, results in the generation of strain pulses that propagate through the structure. The strain pulse is responsive to the electric field created by the electron/hole pairs. The particle displacement associated with these strain pulses is in the z direction. If the number of electrons and holes that are excited is sufficiently large, the accumulation of charge will be enough to reduce the electric field to a value that is close to zero. At this point a further increase in the amplitude of the pump pulse will result in no increase in the amplitude of the generated strain pulses. We refer to the stress generated by the mechanism just described as stress component 1.

There is also stress generated in the structure as a result of two other mechanisms which will be called 2 and 3. The pump light pulse 20 creates strain pulses due to these other mechanisms, as well. The electrons and holes excited by the pump pulse will lose energy by emission of thermal phonons giving a local rise in temperature of the structure. This temperature rise will result in a thermal stress (stress 2) proportional to the thermal expansion coefficient of the material. The presence of the excited electrons and holes also results in a stress in the structure that is proportional to the deformation potential (stress 3). It is noted that these two mechanisms 2 and 3 give a stress that is, to a good approximation, proportional to the intensity of the pump light pulse 20.

Before the excitation of the structure by the pump light pulse, the dielectric constant of the structure is $\in(z)$. The propagation of these strain pulses through the structure results in a time-dependent change $\Delta\in(z,t)$ in the dielectric constant. In turn, this results in a measurable change in the overall optical properties of the structure. Thus the sample's optical properties are responsive to the generated strain pulse. There may be a change in the optical reflectivity, a change in the transmission of light through the structure, a change in the phase of the reflected light, a change in the polarization of the reflected light, or a change in the direction of the reflected light. These changes in any of the optical properties of the sample are measured through the use of a probe light pulse 25, see FIGS. 5 and 6, which is delayed by a time t relative to the pump pulse. The probe light pulse 25 is directed onto the sample 1 with a time delay t in relation to the pump light pulse 20. Such measurements of the optical properties of the sample with the probe light pulse means that the probe light pulse is responsive to the optical properties of the sample. In what follows we refer to the measured change in the optical properties as the measured "signal". The signal reveals the changes occurring inside the sample 1 resulting due to the pump light pulse 20. The signal is associated with the probe light pulse 25.

By analysis of the measured changes in the optical properties just listed and by using estimated values of the derivative of the dielectric constant with respect to strain in each region of the structure, the amplitude of the strain pulse generated in each part of the structure can be determined.

Without intent of limiting, we will here discuss how the measured signal arises when the optical reflectivity is the measured property. An analogous discussion can readily be provided in the case that a different optical property is measured.

The duration of the probe light pulse can be as short as 10 fs or as long as 100 ps. The energy of the probe pulse per unit area of the sample surface can lie in the range between $10^{-5}$ to $10^{-1}$ J/cm$^2$. Without intent of limitation, herein we consider a situation in which the probe light pulse 25 travels essentially perpendicularly to the quantum wells 10. It is straightforward to extend the discussion to consider an arbitrary direction of the probe light pulse 25. The probe pulse is delayed relative to the pump pulse by a time which can be as short as 0.1 ps or as long as several times $10^{-9}$ sec. The pump and probe light pulses can be produced by the same laser or by different lasers. If both pulses come from the same laser, the time delay of the probe relative to the pump can be produced by making the optical path taken to the sample by the probe pulse longer than the optical path for the pump pulse, or by other means known to those skilled in the art.

The change $\Delta R(t)$ in the optical reflectivity at a time t after the application of the pump pulse can be expressed in the form $\Delta R(t) = \int f(z)\eta(z,t)dz$ where $\eta(z,t)$ is the strain due to the sound pulses at position z at time t. The sensitivity function $f(z)$ determines by how much the reflectivity is changed due to the existence of a strain of unit amplitude at a depth z into the sample. If the dielectric constant of each material in the sample is known and the derivative of each of these constants with respect to strain is also known, it is a straightforward problem in optics to calculate $f(z)$.

Figure 2:
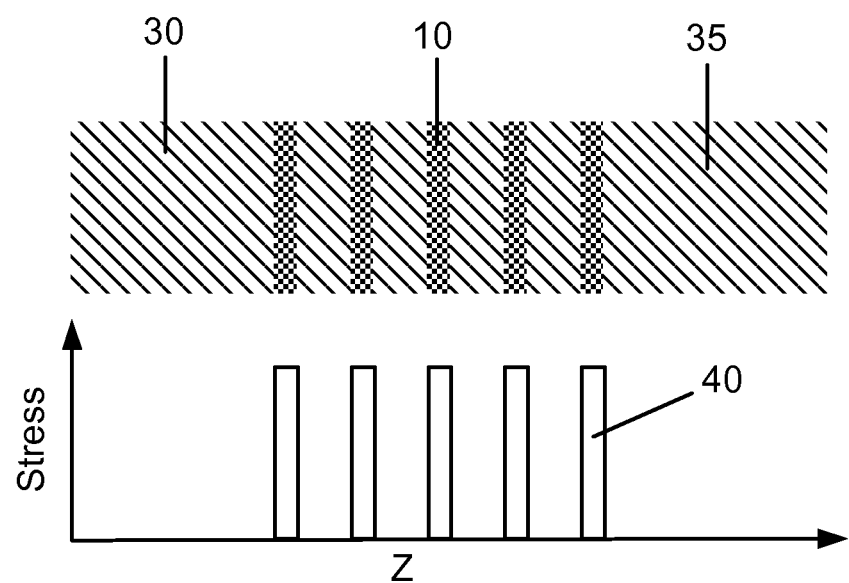
FIG. 2 schematically shows stress generated by a pump light pulse in the MQW in an embodiment of the disclosure.
Figure 3:
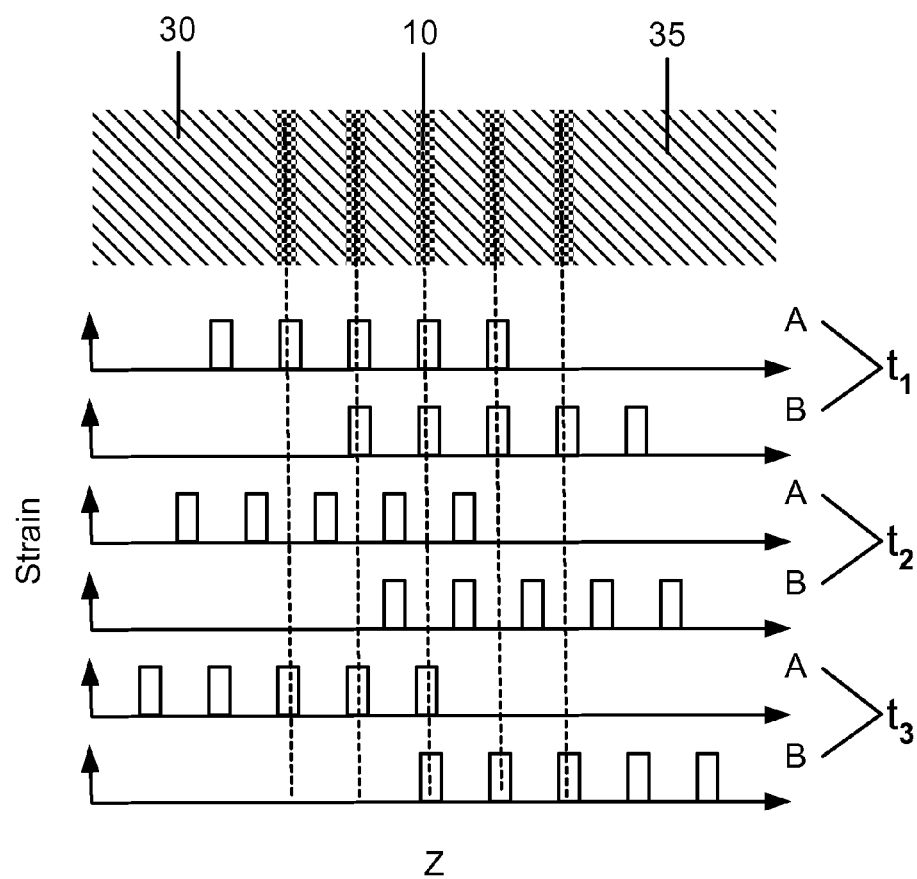
FIG. 3 schematically shows strain pulses traveling in the sample in an embodiment of the disclosure.

The stress generated when a part of the pump pulse is absorbed in the MQW will have a spatial variation that will have the same periodicity as the MQW itself. For simplicity, this is shown in FIG. 2 as a simple "square wave". This is the form that is expected if the stress arises entirely from mechanism 2 and the heat deposited by the photoexcited electrons and holes is deposited entirely into the $In_cGa_{1-c}N$ wells. Inclusion of stress generation mechanisms 1 and 3 would give a more complex stress distribution. This initial stress will result in the propagation of two strain pulses A and B each of the same general shape as the initial stress, and propagating in opposing directions. Strain pulse A propagates towards the free upper surface of the sample 1 and strain pulse B propagates towards the substrate. In FIG. 3 the position of these two strain pulses is shown for three different times $t_1$, $t_2$, $t_3$ after the application of the pump light pulse. For clarity the two strain pulses are shown on separate plots, but it is recognized that at any instant of time the total strain at a position z is the sum of the strain due to each of these pulses. If the total thickness of the MQW region of the sample 1 is 100 nm, the time for the last of these strain pulses to leave the MQW is around 12 ps.

In the time interval immediately after the application of the pump light pulse the two strain pulses A and B travel through the region of the sample containing the MQW. From FIG. 3 it can be seen that at the times $t_1$ and $t_3$ regions of large strain are in the $In_cGa_{1-c}N$ layers whereas at time $t_2$ the regions of large strain are located in the GaN layers that lie between the $In_cGa_{1-c}N$ wells. As a result of the motion of the strain pulses, the change in the optical properties of both the $In_cGa_{1-c}N$ layers and the GaN layers will vary periodically with time. This leads to a variation of the measured signal, i.e., a variation of the measured optical reflectivity of the entire sample, which is periodic in time. If we denote the period by $\tau$, then $$\tau = \frac{d_{In}}{v_{In}} + \frac{d_{Ga}}{v_{Ga}}$$

where $d_{In}$ is the width of one $In_cGa_{1-c}N$ layer, $d_{Ga}$ is the thickness, or width, of one GaN layer, $v_{In}$ is the sound velocity in $In_cGa_{1-c}N$ and $v_{Ga}$ is the sound velocity in GaN. It follows that a measurement of the period $\tau$ can be used to determine the width and spacing of the quantum wells.

The measured signal which is contained in the probe light pulse typically has at least one periodicity. As discussed above, desired parameters, such as the width and/or a spacing of the quantum wells, may be determined from one, or more, of the at least one periodicities of the signal. The strain pulses traveling through the region of the sample containing the MQW give rise to an initial periodicity in the signal. This periodicity is so named because it is the first to be measurable in the signal as function of the time delay. The initial periodicity arises out of all periodicities of the signal nearest to the zero value of the time delay. The initial periodicity typically has an initial period and an amplitude envelope. The period $\tau$ discussed above, is the initial period. The amplitude envelope will be discussed next.

Figure 4:
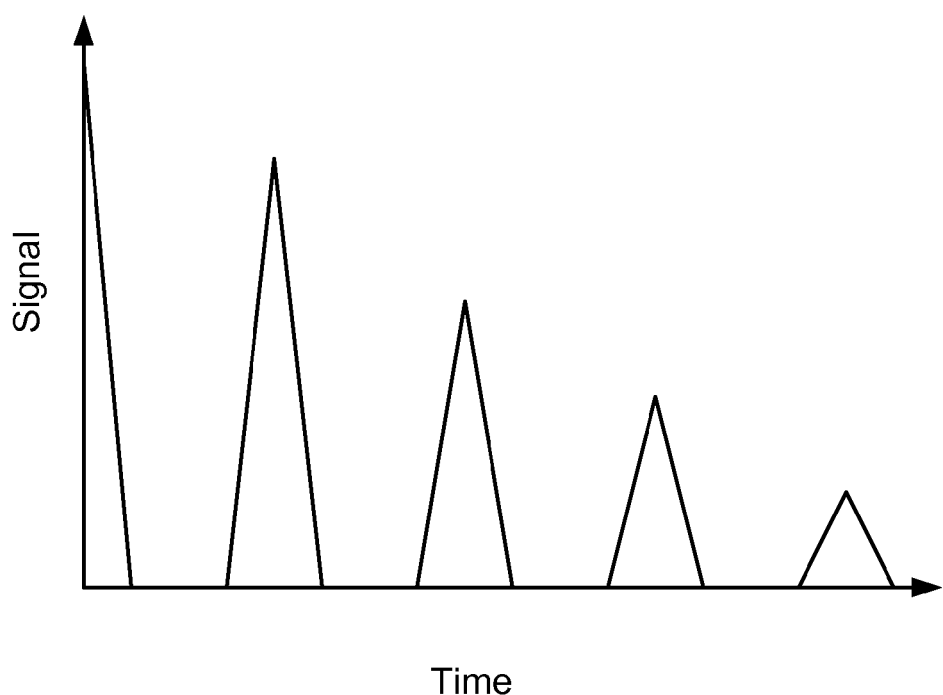
FIG. 4 schematically shows a periodic part of a signal arising due to the MQW structure in an embodiment of the disclosure.

The amplitude of the oscillations with period $\tau$ will decrease with increasing time because the strain pulses A and B leave the region that is occupied by the MQW. Once a part of the strain pulse has left the region of the MQW it will no longer contribute to the oscillation in the measured signal that has a period $\tau$. As a result, the form of the signal is as shown schematically in FIG. 4. The rate at which the signal amplitude decreases with time is determined by the total width of the MQW part of the structure. Thus a measurement of the overall envelope of the amplitude of the oscillatory contribution to the measured signal can be used to give information about the width of a region 11 that the quantum wells occupy. The width and spacing of the quantum wells, and the width of a region that the quantum wells occupy are all desired parameters of the sample.

It is possible that in some samples one or more of the quantum wells may have a width or other property that differs from the desired width or property. This will result in a shape for the strain pulses A and B that deviates from a regular periodic form. This change in shape will in turn modify the way in which the amplitude of the oscillatory contribution to the measured signal (as just discussed) decreases with time. Hence a measurement of the way in which the amplitude of the oscillatory contribution to the measured signal decreases with time can be used to detect deviations of the geometry of the structure from the geometry that is desired for the device, such as an LED.

Although the above discussion has been presented in terms of a MQW structure that is intended to be perfectly periodic, it is clear that a similar approach can be used to detect deviations from the ideal geometry for samples in which the intended geometry is not periodic.

As noted above, stress mechanisms 2 and 3 lead to stress which is proportional to the energy, or intensity, of the pump pulse, whereas mechanism 1 results in a stress which is linear in the intensity for small intensity of the pump pulse but which saturates at a constant value when the pump intensity, or energy, reaches a certain value. This different variation of stress with energy provides a means to distinguish the contribution from mechanism 1 from the contributions from 2 and 3. More specifically, the following quantities may be determined: a) the amplitude $\sigma_{max}$ of the stress due to mechanism 1 at saturation, i.e., the maximum value of the contribution of stress mechanism 1 to the stress perpendicular to the plane of the QW, $\sigma_3$; b) the energy per unit area $(E/A)_{max}$ of the pump pulse that is needed in order to produce the saturated value of the stress from mechanism 1; c) the sum of the amplitudes of the stresses from mechanisms 2 and 3 per unit value of pump energy per unit area of the sample.

In a first application A1, the strain in a quantum well is determined using the following method. As explained above, $\sigma_{max}$ is determined by the initial electric field in the quantum well and by the piezoelectric coefficients of the material. The piezoelectric coefficients are known. The initial electric field in the material is proportional to the strain in the quantum well as already described. The generated electron/hole pairs due to the absorbtion of the pump light pulse 20 in the QW 10 create an electric field that modifies the initial electric field in the quantum well. As discussed above, due to mechanism 1 the generated stress is proportional to the intensity of the pump light pulse at small intensities, but it saturates at large ones. The measured signal has an amplitude, which depends on the generated stress, and due to the piezoelectricity of the QW, the strain pulse depends on the electric field created by the electron/hole pairs. Thus, the signal amplitude is responsive to the electron/hole created electric field. The created electric field depends on the number of electron/hole pairs generated, hence on the intensity of the pump light pulse. Consequently, the signal amplitude may depend on the intensity of the pump light pulse. Not wishing to be bound by theory, a plot of the signal amplitude vs pump light pulse intensity may be of a piecewise linear character. Reaching the pump light pulse intensity at which the contribution of stress mechanism 1 becomes saturated may be observed as a break in the slope of the signal amplitude vs pump light pulse intensity plot. Thus, a measurement of $\sigma_{max}$ can be used to give the strain in each quantum well. Application A1 yields state of stress in the quantum wells, which size of such state of stress is a parameter of interest of the sample.

In a second application A2, the optical absorption in a quantum well is determined using the following method. In order to produce the saturated value $\sigma_{max}$ of the stress, the pump light pulse has to excite enough electrons in the quantum well to reduce the field inside the layer to a value close to zero. From the measured strain in a quantum well, this required number of electrons can be calculated Each photon that is absorbed in a quantum well results in one electron hole pair. Thus, a measurement of $(E/A)_{max}$ can be used to determine the optical absorption, expressed typically as an absorption coefficient as known in the art, in a well, i.e., the fraction of the incident photons which are absorbed in a quantum well. The absorption coefficient of the quantum wells is a desired parameter.

In a third application A3, it is possible to determine the time that the excited electron/hole pairs remain in the wells after being excited, i.e., the time it takes the electrons and holes to recombine, which is the electron/hole pair lifetime in the quantum wells. To provide a method and system for the measurement of the recombination of the electrons and holes, a lead pump pulse 23 of large amplitude is directed to the sample 1 so as to reduce the electric field in each well to a value close to zero. Same as for the pump pulse 20, for the lead pump pulse 23 part of the light is reflected 29, and part 24 penetrates the sample. The part that penetrates 24 may be absorbed by the quantum wells 10. The lead pump pulse 23 is applied with a lead time interval $\tau_2$ ahead of pump pulse 20. The probe light pulse 25 is directed to the sample, as before, with a time delay t in relation to the pump light pulse 20, meaning at time $\tau_2$+t relative to the lead pump pulse 23. If the lead time interval $\tau_2$ is very short, the electric field will still be at a very low value as a result of the lead pump pulse, and so there will be only a very small change in the electric field resulting from the application of the pump pulse 20. When the lead time interval $\tau_2$ is increased, more of the electrons and holes generated by the lead pump pulse will have recombined and the structure will have returned to a state closer to its condition before the application of the lead pump pulse. In this situation the amplitude of the stress generated by the pump pulse 20 will become closer to the amplitude generated by the lead pump pulse. The measured signal amplitude reflects the stress pulse amplitude. Consequently, the signal amplitude has a dependence on the lead time interval. By making measurements of the ratio of the amplitude of the stress pulses generated by the pump pulse 20 to the amplitude of the stress pulses generated by the lead pump pulse as a function of the lead time interval $\tau_2$, it is possible to determine the rate at which the electrons and holes recombine. Thus, the electron/hole pair lifetime in the quantum wells is deduced the from the dependence of the signal amplitude on the lead time interval. The duration of the lead pulse can be as short as 10 fs or as long as 100 ps. The energy deposited into the sample by the lead pulse may representatively lie in the range between $10^{-3}$ to $10^{-1}$ J/cm$^2$. The wavelength of the lead pulse and the second pulse can be the same or different. The lead time interval $\tau_2$ between the application of the lead pulse 23 and the pump pulse 20 can be varied over the range from 1 ps to 10 ns.

The above discussion has considered in detail the contribution to the measured signal that arises in the time interval immediately after the application of the pump pulse, i.e., in the time range during which the strain pulses A and B are traveling through the MQW region of the structure. At later times there may still be a significant measured signal but which has a different origin. Here we mention some contributions to the measured signal which may be important in certain samples. In other samples there may be other contributions arising from the same or related mechanisms. The measurement and analysis of these signals can be used to determine more characteristics of the sample, or can be used in conjunction with the measurements made immediately after the application of the pump pulse to enhance the accuracy with which parameters of the sample can be determined.

Figure 5:
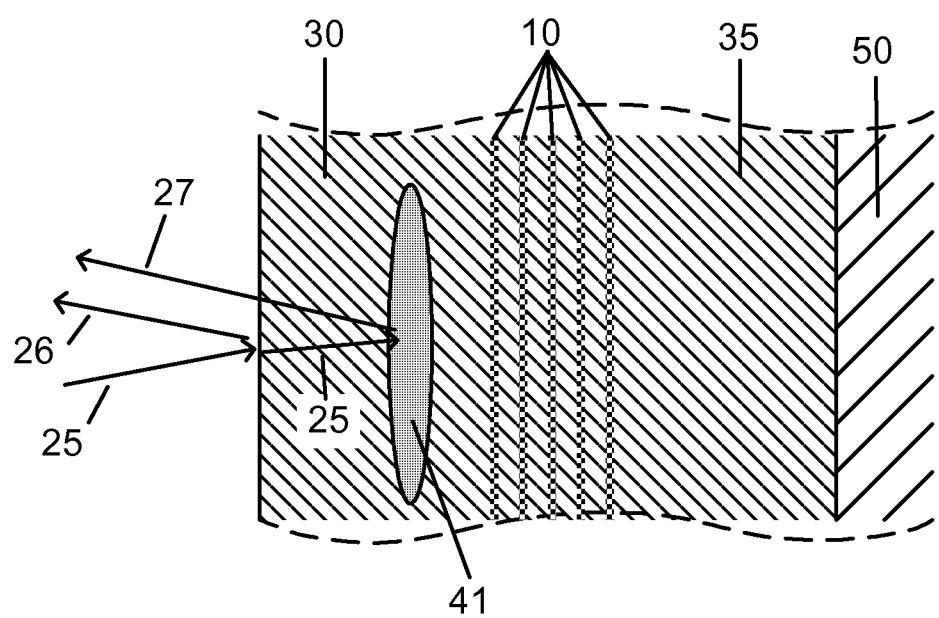
FIG. 5 schematically shows a reflection from a strain pulse propagating toward the surface in an embodiment of the disclosure.

A first contribution arises from the mechanism shown in FIG. 5. The strain pulse A generated in the MQW propagates as a strain pulse 41 in the top layer 30 in the direction towards the free upper surface of the sample. When the probe light pulse 25 is incident onto the sample, a part of the light 26 will be reflected at the upper free surface of the sample giving a reflected beam. Part of the probe light will penetrate into the sample and will be reflected when it reaches the location of strain pulse 41 propagating in the p-GaN layer. This reflected light will result in beam 27. The amplitude of beam 26 is independent of the amplitude of the strain whereas beam 27 is proportional to the amplitude of the strain. Hence beam 27 is much weaker than beam 26. Depending on the location of strain pulse A the beams 26 and 27 will interfere constructively or destructively. As a result there will be a contribution to the measured signal (i.e., the optical reflectivity) which varies periodically with the time delay t of the probe light pulse. In the case that the probe light is at nearly normal incidence to the surface of the sample, the period of these oscillations is equal to the time that it takes the strain pulse 41 to propagate a distance equal to one half of the wavelength of light inside the p-GaN. Thus the period is $$\tau_1 = \frac{\lambda_0}{2nv_{Ga}}$$

where $\lambda_0$ is the wavelength of the probe light in vacuum and n is the refractive index of the GaN. The strain pulse 41 is the sum of the strain pulses generated by each of the quantum wells. Thus, the amplitude of the oscillations in the optical reflectivity provides further information about the stress generation in the wells. This can be used to supplement the information obtained in applications A1, A2 and A3 described above and to provide more detailed information about the state of strain in the quantum wells, the optical absorption in the wells, etc.

In a metrology system based on this invention the determination of the properties of the quantum wells would be done using simulations of the strain pulse propagation and the effect of the strain pulses on the optical reflectivity. The simulations would be based on assumed values for some number of parameters, and these parameters would be adjusted to get the best fit to all of the measured quantities. The measured quantities could include the amplitude A discussed here plus the measurements described in the previous sections. For example, the parameters might include the widths of the wells, the strain in each well, and the optical absorption in each well. These parameters would then be adjusted to make a best fit to the data. In a typical situation only those measurements that were of most use would be made. The general procedure would be similar to what is described in U.S. Pat. No. 5,844,684 and U.S. Pat. No. 5,748, 318. The apparatus to carry out the optical testing of the MQW structures, the generation of the various pump and probe pulses, their power and timing relations, the detection of the signal, is already known in the art.

Figure 6:
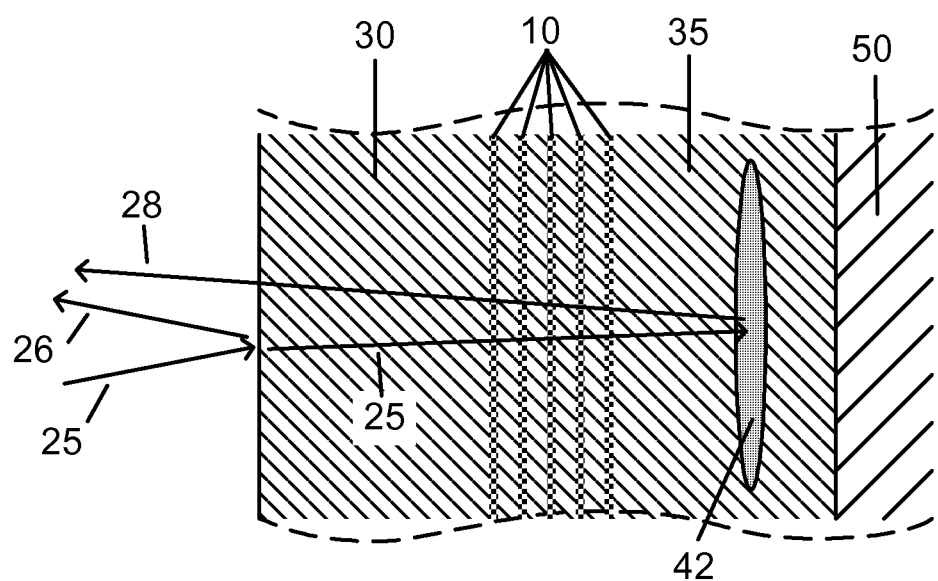
FIG. 6 schematically shows a reflection from a strain pulse propagating toward the substrate in an embodiment of the disclosure.

A second contribution to the measured signal will arise from the partial reflection of the probe light at the strain pulse 42 which is propagating in the bottom layer 35, which may be a n-GaN layer (FIG. 6). This strain pulse 42 was generated in the MQW as strain pulse B. This will also give a contribution to the measured signal which has a period $\tau_1$ as just discussed. This second contribution is of interest because strain pulse 42 will propagate though the n-GaN layer and reach the substrate. As it approaches the substrate it will pass through the region of the n-GaN which contains a high density of dislocations. The presence of these dislocations will modify the velocity of the sound and cause a change in the period $\tau_1$ of the oscillatory contribution to the measured signal, due to the probe light reflected 28 from the strain pulse 42 propagating toward the substrate 50. From this change it is possible to deduce the density of dislocations. The dislocations may also result in an attenuation of the strain pulse 42 and a resulting decrease of the amplitude of the oscillatory contribution to the measured signal. A measurement of this rate of decrease can thus also be used to deduce the density of dislocations.

It is also possible that the dislocations may result in a significant modification of the dielectric constant of the GaN. Since the period $\tau_1$ is dependent on the refractive index, a modification of the real part of the dielectric constant will result in a change in $\tau_1$. Measurement of this change can also be used to determine the dislocation density. A change in the absorption of light due to the presence of dislocations will result in a change in the amplitude of the oscillatory component in the measured signal.

All periodicities emerging in the signal that are later in the time delay than the initial periodicity, which is due to the strain pulses traveling through the region of the sample containing the MQW, may collectively be named additional periodicities having additional periods. Such additional period may be due, as discussed above, to various interferences of the various reflected components of the probe light pulse. The additional periodicities all have in common that they emerge, and thus are measurable, later in the time delay than the initial periodicity. As discussed above, the dislocation density, a desirable parameter of the sample, may be determined from an additional periodicity. As other desirable parameters may also be derivable from one or more of the additional or initial periodicities, which are all contained in the signal, which as discussed contains at least one periodicity.

In much of the above discussion the effect of the optical absorption of the probe light pulse in the different layers of the structure has not been considered. It is noted that this simplification has been made without intent of limiting, solely for the purpose of clarity in explanation. If the absorption is appreciable, it will result in a modification of the amplitude of the oscillatory contribution to the measured signal, but this modification can be taken into consideration and allowed for by those skilled in the art. The methods and apparatus in embodiments of the present disclosure in general are characterized as optical testing method and apparatus for revealing characteristics of the sample containing multiple quantum wells.

When the strain pulse 41A reaches the free surface of the sample it will be reflected and there will be an abrupt change in the phase of the oscillatory component to the signal. The time at which this abrupt change in phase occurs can be used to deduce the thickness of the p-GaN layer.

When the strain pulse (B) 42 reaches the surface of the substrate it will be partially reflected and partially transmitted into the substrate. As a result, after this time there will be two oscillatory components in the measured signal. The first comes from the reflected part of strain pulse B which is in the n-GaN layer and is now propagating away from the substrate; the second comes from the part of the strain pulse which has been transmitted into the substrate. These two components will have different periods since the velocities of the two pulses are different and the pulses will be propagating in materials which have a different refractive index. The time at which the strain pulse B reaches the substrate and the oscillatory part of the measured signal undergoes a change in form can be used to deduce the thickness of the n-GaN layer.

It is important to note that the description given above for the applications A1, A2 and A3 has made explicit reference to analysis of the measured signal in the time interval during which a significant part of the strain pulses A and B are within, or partially within, the MQW region of the structure. However, the general approach described in these three applications (i.e., measurements at low and at high pump pulse amplitudes and measurements with two pump pulses) can also be employed in conjunction with the measurements of the oscillatory component of the measured signal at later times that arises when the strain pulses A and B are no longer within the MQW region of the structures.

While the above discussion has described in detail how the invention can be used to make measurements of semiconductor structures, such as GaN, that are fabricated for use as light emitting diodes, it is noted that the invention can also be used for a wider variety of structures. This includes structures that are based on similar materials and designed for use as laser diodes and high power field effect transistors (FETs).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

The foregoing specification also describes processing steps. It is understood that the sequence of such steps may vary in different embodiments from the order that they were detailed in the foregoing specification. Consequently, the ordering of processing steps in the claims, unless specifically stated, for instance, by adjectives as "before", "preceding", "ahead of", "after", and similar ones, does not imply or necessitate a fixed order of step sequence.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "underneath", "top", "side", "over", "parallel", "perpendicular", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

The invention claimed is:

1. A method, comprising:
accepting a sample, wherein said sample comprises quantum wells sandwiched in-between two semiconductor layers, wherein said sample has an optical property, and has a parameter of interest;
creating a strain pulse inside said sample by directing a pump light pulse onto said sample and selecting the wavelength of said pump light pulse in such manner that said quantum wells absorb said pump light pulse whereby generating electron/hole pairs in said quantum wells, wherein said quantum wells are piezoelectric whereby said strain pulse is responsive to an electric field created by said electron/hole pairs, and wherein said optical property is responsive to said strain pulse;
measuring a signal using a probe light pulse, wherein said probe light pulse is directed onto said sample with a time delay in relation to said pump light pulse, and said probe light pulse is responsive to said optical property, wherein said signal derives from a change in said optical property as function of said time delay, wherein said signal has an amplitude, an said amplitude is responsive to said electric field; and
deriving said parameter of interest from a characteristic of said amplitude.

2. The method of claim 1, wherein said pump light pulse has an intensity and said characteristic of said amplitude is a dependence of said amplitude on said intensity.

3. The method of claim 2, wherein said quantum wells are under a stress, and said parameter of interest is the size of said stress.

4. The method of claim 2, wherein said quantum wells have an absorption coefficient, and said parameter of interest is said absorption coefficient.

5. The method of claim 1, wherein said method further comprises directing a lead pump pulse onto said sample, wherein said lead pump pulse precedes said pump light pulse by a lead time interval, wherein said electron/hole pairs have a lifetime, wherein said characteristic of said amplitude is a dependence of said amplitude on said lead time interval, and said parameter of interest is said lifetime of said electron/hole pairs.

6. A method, comprising:
accepting a sample, wherein said sample comprises quantum wells sandwiched in-between two semiconductor layers, wherein said sample has an optical property, and has a parameter of interest;
creating a strain pulse inside said sample by directing a pump light pulse onto said sample and selecting the wavelength of said pump light pulse in such manner that said quantum wells absorb said pump light pulse, wherein said optical property is responsive to said strain pulse;
measuring a signal using a probe light pulse, wherein said probe light pulse is directed onto said sample with a time delay in relation to said pump light pulse, and said probe light pulse is responsive to said optical property, wherein said signal derives from a change in said optical property as function of said time delay, and said signal comprises at least one periodicity; and
deducing said parameter of interest from one or more of said at least one periodicity.

7. The method of claim 6, wherein said signal comprises an initial periodicity, wherein said initial periodicity has an initial period and an amplitude envelope, wherein said initial periodicity is first to be measurable in said signal as function of said time delay.

8. The method of claim 7, wherein said parameter of interest is a width and/or a spacing of said quantum wells and is being deduced from said initial period of said initial periodicity.

9. The method of claim 7, wherein said parameter of interest is a width of a region that said quantum wells occupy in said sample and is being deduced from said amplitude envelope of said initial periodicity.

10. The method of claim 7, wherein said signal comprises an additional periodicity having an additional period, wherein said additional periodicity is measurable later in said time delay than said initial periodicity.

11. The method of claim 10, wherein said parameter of interest is a dislocation density in said sample and is being deduced from said additional period of said additional periodicity.

12. A system, comprising:
a sample, wherein said sample comprises quantum wells sandwiched in-between two semiconductor layers, wherein said quantum wells are of a piezoelectric material, wherein said sample has an optical property, and has a parameter of interest;
a pump light pulse, wherein said pump light pulse is directed onto said sample and has such wavelength that is absorbed by said quantum wells whereby capable of generating electron/hole pairs in said quantum wells and to create a strain pulse in said sample;
an electric field created by said electron/hole pairs, wherein due to said piezoelectric material said strain pulse is responsive to said electric field, and wherein said optical property is responsive to said strain pulse;
a probe light pulse, wherein said probe light pulse is directed onto said sample with a time delay in relation to said pump light pulse, and said probe light pulse is responsive to said optical property;
a signal, wherein said signal is contained in said probe light pulse, wherein said signal derives from a change in said optical property as function of said time delay, wherein said signal has an amplitude, and said amplitude is responsive to said electric field; and
wherein said parameter of interest is derivable from a characteristic of said amplitude.

13. The system of claim 12, wherein said pump light pulse has an intensity, and said characteristic of said amplitude is a dependence of said amplitude on said intensity.

14. The system of claim 13, wherein said quantum wells are under a stress, and said parameter of interest is the size of said stress.

15. The system of claim 13, wherein said quantum wells have an absorption coefficient, and said parameter of interest is said absorption coefficient.

16. The system of claim 12, wherein said electron/hole pairs have a lifetime, said system further comprising:
a lead pump pulse, wherein said lead pump pulse is directed onto said sample, wherein said lead pump pulse precedes said pump light pulse by a lead time interval; and wherein said characteristic of said amplitude is a dependence of said amplitude on said lead time interval, and said parameter of interest is said lifetime of said electron/hole pairs.

17. A system, comprising:
a sample, wherein said sample comprises quantum wells sandwiched in-between two semiconductor layers, wherein said sample has an optical property, and has a parameter of interest;
a pump light pulse, wherein said pump light pulse is directed onto said sample and has such wavelength that is absorbed by said quantum wells and is capable to create a strain pulse in said sample, wherein said optical property is responsive to said strain pulse;
a probe light pulse, wherein said probe light pulse is directed onto said sample with a time delay in relation to said pump light pulse, and said probe light pulse is responsive to said optical property;
a signal, wherein said signal is contained in said probe light pulse, wherein said signal derives from a change in said optical property as function of said time delay, and said signal comprises at least one periodicity; and
wherein said parameter of interest is derivable from one or more of said at least one periodicity.

18. The system of claim 17, wherein said signal comprises an initial periodicity, wherein said initial periodicity has an initial period and an amplitude envelop, wherein said initial periodicity is the first to emerge in said signal as function of said time delay.

19. The system of claim 18, wherein said parameter of interest is a width and/or a spacing of said quantum wells and is being deduced from said initial period of said initial periodicity.

20. The system of claim 18, wherein said parameter of interest is a width of a region that said quantum wells occupy in said sample and is being deduced from said amplitude envelope of said initial periodicity.

21. The system of claim 18, wherein said signal comprises an additional periodicity having an additional period, wherein said additional periodicity emerges later in said time delay than said initial periodicity.

22. The system of claim 21, wherein said parameter of interest is a dislocation density in said sample and is being deduced from said additional period of said additional periodicity.

* * * * *